United States Patent
Li et al.

(10) Patent No.: US 7,843,270 B2
(45) Date of Patent: Nov. 30, 2010

(54) LOW NOISE AMPLIFIER CIRCUIT WITH NOISE CANCELLATION AND INCREASED GAIN

(75) Inventors: Qiang Li, Singapore (SG); Yue Ping Zhang, Singapore (SG)

(73) Assignee: Nanyang Technological University, Singapore (SG)

( * ) Notice: Subject to any disclaimer, the term of this patent is extended or adjusted under 35 U.S.C. 154(b) by 105 days.

(21) Appl. No.: 12/444,137

(22) PCT Filed: Oct. 4, 2006

(86) PCT No.: PCT/SG2006/000294

§ 371 (c)(1), (2), (4) Date: Apr. 2, 2009

(87) PCT Pub. No.: WO2008/041948

PCT Pub. Date: Apr. 10, 2008

(65) Prior Publication Data

US 2010/0237946 A1 Sep. 23, 2010

(51) Int. Cl.
 *H03F 3/68* (2006.01)
(52) U.S. Cl. .................. 330/295; 330/124 R; 330/53
(58) Field of Classification Search ............ 330/295, 330/124 R, 53, 301
See application file for complete search history.

(56) References Cited

U.S. PATENT DOCUMENTS

| | | | | |
|---|---|---|---|---|
| 4,278,889 | A * | 7/1981 | Erker | 378/19 |
| 5,410,274 | A * | 4/1995 | Birdsall et al. | 330/265 |
| 7,486,141 | B2 * | 2/2009 | Do et al. | 330/276 |
| 7,519,348 | B2 * | 4/2009 | Shah | 455/285 |
| 7,592,866 | B2 * | 9/2009 | Meharry | 330/195 |
| 7,729,676 | B2 * | 6/2010 | Bult et al. | 455/234.1 |
| 2006/0097786 | A1 | 5/2006 | Su et al. | |
| 2006/0097792 | A1 | 5/2006 | Ryu et al. | |

FOREIGN PATENT DOCUMENTS

JP 09-04612 A 2/1997

OTHER PUBLICATIONS

Bevilacqua, Andrea, et al., "An Ultrawideband CMOS Low-Noise Amplifier for 3.1-10.6-GHz Wireless Receivers," IEEE Journal of Solid-State Circuits, vol. 39, No. 12, pp. 2259-2268, Dec. 2004.

(Continued)

*Primary Examiner*—Patricia Nguyen
(74) *Attorney, Agent, or Firm*—Cahn & Samuels, LLP

(57) ABSTRACT

A low noise amplifier circuit including a front end voltage sensing and matching amplification circuit, a gain circuit and a combining circuit is disclosed. The front end voltage sensing and matching amplification circuit includes an input and two outputs and provides a matched signal at each output. The gain circuit includes two inputs, each input being respectively coupled to at least one of the two outputs of the front end voltage sensing and matching amplification circuit. The gain circuit further includes two outputs and an output signal is provided at each output of the gain circuit. The combining circuit combines the two output signals of the gain circuit. The combining circuit includes two inputs, each input is respectively coupled to at least one of the two outputs of the gain circuit. The combining circuit further includes an output providing a combined signal.

22 Claims, 8 Drawing Sheets

OTHER PUBLICATIONS

Bruccoleri, F., et al., "Noise Cancelling in Wideband CMOS LNAs," 2002 IEEE International Solid-State Circuits Conference Digest Technical Papers (ISSCC), vol. 1, Feb. 3-7, 2002, pp. 406-407.

Bruccoleri, Frederico, et al., "Wide-Band CMOS Low-Noise Amplifier Exploiting Thermal Noise Canceling," IEEE Journal of Solid-State Circuits, vol. 39, No. 2, pp. 275-282, Feb. 2004.

Chiang, Ming-Chou, et al., "Analysis, Design, and Optimization of InGaP-GaAs HBT Matched-Impedance Wide-Band Amplifiers with Multiple Feedback Loops," IEEE Journal of Solid-State Circuits, vol. 37, No. 6, pp. 694-701, Jun. 2002.

Gharpurey, Ranjit, "A Broadband Low-Noise Front-End Amplifier for Ultra Wideband in 0.13 μm CMOS," Proceedings of IEEE 2004 Custom Integrated Circuits Conference (CICC), Oct. 3-6, 2004, pp. 605-608.

Ismail, Aly, et al., "A 3-10-GHz Low-Noise Amplifier with Wideband LC-Ladder Matching Network," IEEE Journal Solid-State Circuits, vol. 39, No. 12, pp. 2269-2277, Dec. 2004.

Kim, Chang-Wan, et al., "An Ultra-Wideband CMOS Low-Noise Amplifier for 3-5-GHz UWB System," IEEE Journal Solid-State Circuits, vol. 40, No. 2, pp. 544-547, Feb. 2005.

Knapp, Herbert, et al., "15 GHz Wideband Amplifier with 2.8 dB Noise Figure in SiGe Bipolar Technology," 2001 IEEE Radio Frequency Integrated Circuits (RFIC) Symposium Digest Papers, May 20-22, 2001, pp. 287-290.

Lee, Hyung-Jin, et al., "A Systematic Approach to CMOS Low Noise Amplifier Design for Ultrawideband Applications", IEEE International Symposium on Circuits and Systems (ISCAS) (IEEE Cat. No. 05CH37618), vol. 4, pp. 3962-3965, Piscataway, NJ, USA, ISBN 0780388348.

Liao, Chih-Fan, et al., "A Broadband Noise-Canceling CMOS LNA for 3.1-10.6-GHz UWB Receiver," Proceedings of IEEE 2005 Custom Integrated Circuits Conference (CICC), Sep. 18-21, 2005, pp. 161-164.

Liu, Ren-Chieh, et al., "A 0.5-14-GHz 10.6-dB CMOS Cascode Distributed Amplifier," 2003 Symposium on VLSI Digest of Technical Papers, Jun. 12-14, 2003, pp. 139-140, IEEE.

Sang,Ze-hua, et al., "A wideband low noise amplifier for ultra wide band system", Microelectronics, vol. 36, No. 1, pp. 114-Abstract, Feb. 2006, ISSN 1004-3365.

\* cited by examiner

122

LOW NOISE AMPLIFIER CIRCUIT WITH NOISE CANCELLATION AND INCREASED GAIN

This application is the National Stage of International Application No. PCT/SG2006/000294, filed on Oct. 4, 2006.

I. FIELD OF THE INVENTION

The present invention relates to the field of low noise amplifiers (LNA), and in particular, to low noise amplifier circuits with noise cancellation and increased gain.

II. BACKGROUND OF THE INVENTION

Wideband and ultra-wideband LNAs have received extensive research interests in recent years. A wide range of modern and future communication systems have been proposed that operates over a bandwidth exceeding several GHz, examples of these systems include software-defined radio, ultra-wideband (UWB), and so on. This poses a more stringent requirement on the UWB transceiver, especially for the front-end LNA, which has to provide an ultra-wide bandwidth with reasonable noise figure and impedance matching.

Traditionally, these types of wideband amplifiers were implemented with balanced or distributed architectures that were originally used in microwave circuit design as described in publication "A 0.5-14-GHz 10.6-dB CMOS Cascode Distributed Amplifier", Liu R. C, et al, 2003 Symposium on VLSI Circuits Digest of Technical Papers. However, large area occupation and high power dissipation of traveling-wave amplifier make it infeasible for low-power single-chip integration. Lumped implementations of UWB LNA were normally achieved by negative feedback or multi-section LC-network. Meanwhile, inductor peaking technique is often adopted for bandwidth enhancement. However, the extra passive devices used for matching purpose increase design complexity and area occupation.

Comparing with narrowband LNA designs, severe tradeoffs between noise figure and source impedance matching exist in wideband LNA. Most of reported UWB LNA designs are focused on bandwidth enhancement. As a result, few of them achieve comparable noise performance. A CMOS UWB LNA employing noise-canceling technique is reported in publication "A broadband noise-canceling CMOS LNA for 3.1-10.6-GHz UWB receiver", Liao C. H. et al, IEEE 2005 Custom Integrated Circuits Conference where inductive series and shunt peaking techniques are used to extend the effective bandwidth of noise canceling. Another wide-band LNA design exploiting thermal noise canceling technique is reported in publication "Wide-band CMOS Low-Noise Amplifier Exploiting Thermal Noise Canceling", Federico Bruccoleri et. al, IEEE Journal of Solid-State Circuits, Vol. 39, No. 2, Feb. 2004, where thermal noise of input matching transistor can be sensed and canceled by the feed-forward configurations. This avoids the potential instability due to global negative feedbacks. However, the gain performance of such a configuration is often less superior.

There is less freedom in controlling the gain performance of CMOS UWB LNA in prior art devices, especially in the GHz range. Comparing to SiGe BiCMOS where higher gm is available, the gain issue becomes more severe when it is applied to CMOS devices. Therefore, an objective of the present invention is to provide an alternative low noise amplifier with noise cancellation and increased gain thereby advantageously avoids or reduces some of the above-mentioned drawbacks of prior art devices.

III. SUMMARY OF THE INVENTION

In one embodiment of the invention, a low noise amplifier circuit is provided including a front end voltage sensing and matching amplification circuit having an input and two outputs, the front end voltage sensing and matching amplification circuit providing a matched signal at each output. The low noise amplifier circuit further includes a gain circuit having two inputs, each input being respectively coupled to at least one of the two outputs of the front end voltage sensing and matching amplification circuit, the gain circuit further having two outputs, an output signal being provided at each output of the gain circuit. The low noise amplifier circuit further includes a combining circuit combining the two output signals of the gain circuit, the combining circuit having two inputs, each input being respectively coupled to at least one of the two outputs of the gain circuit, the combining circuit further including an output providing a combined signal.

In one embodiment of the invention, the gain circuit includes a first gain enhancement circuit having an input coupled to a first output of the front end voltage sensing and matching amplification circuit and an output coupled to a first input of the combining circuit. The gain circuit further includes a second gain enhancement circuit having an input coupled to a second output of the front end voltage sensing and matching amplification circuit and an output coupled to a second input of the combining circuit. The second gain enhancement circuit is coupled to the first gain enhancement circuit. The first gain enhancement circuit and the second gain enhancement circuit have a common current branch and provide two concurrent feedforward paths to the combining circuit.

In another embodiment of the invention, the gain circuit further includes a virtual ground circuit connected between the first gain enhancement circuit and the second gain enhancement circuit on one side and to a reference potential on the other side. The reference potential may be a ground connection. The virtual ground circuit includes a capacitive element, a first terminal of which being connected to the first gain enhancement circuit and the second gain enhancement circuit and a second terminal of which being connected to the reference potential.

In a further embodiment of the invention, the low noise amplifier further includes an alternating current coupling circuit having an input coupled to the first output of the front end voltage sensing and matching amplification circuit and an output coupled to the input of the first gain enhancement circuit. The alternating current coupling circuit further includes a capacitive element and a resistive element.

In another embodiment of the invention, the low noise amplifier further includes a current enhancement circuit connected between the first gain enhancement circuit and the second gain enhancement circuit, the current enhancement circuit providing additional current to the second gain enhancement circuit. The current enhancement circuit further being connected to the virtual ground circuit. The current enhancement circuit includes a resistive element.

In another embodiment of the invention, the front end voltage sensing and matching amplification circuit includes a voltage sensing amplifier circuit and a matching amplifier circuit.

In another embodiment of the invention, the voltage sensing amplifier circuit includes an input and an output, the output being coupled to an input of the second gain enhancement circuit. The voltage sensing amplifier circuit includes a feedback resistor and a source resistor sensing the voltage applied to the input of the voltage sensing amplifier circuit.

In another embodiment of the invention, the matching amplifier circuit includes an input and an output being coupled to the first gain enhancement circuit. The matching amplifier circuit includes the feedback resistor, a resistive element and a transistor providing the source resistor matching.

In another embodiment of the invention, the first gain enhancement circuit includes a transistor and a resistive element. The second gain enhancement circuit includes a transistor and a resistive element.

In another embodiment of the invention, the combining circuit includes two serially coupled transistors.

In another embodiment of the invention, the low noise amplifier further includes a first capacitor peaking circuit connected between the first gain enhancement circuit and the second gain enhancement circuit. The first capacitor peaking circuit includes a capacitive element and a resistive element.

In another embodiment of the invention, the low noise amplifier further includes a second capacitor peaking circuit connected between the second gain enhancement circuit and a reference potential. The reference potential may be a ground connection. The second capacitor peaking circuit includes a capacitive element and a resistive element.

In another embodiment of the invention, the low noise amplifier further includes a third capacitor peaking circuit connected between the combining circuit and a reference potential. The reference potential may be a ground connection. The third capacitor peaking circuit includes a capacitive element and a resistive element.

In one embodiment of the invention, a gain circuit in a low noise amplifier is provided. The gain circuit includes a first gain enhancement circuit having an input coupled to a first output of a front end voltage sensing and matching amplification circuit and having an output. The gain circuit further includes a second gain enhancement circuit coupled to the first gain enhancement circuit and having an input coupled to a second output of the front end voltage sensing and matching amplification circuit and having an output. The gain circuit further includes a virtual ground circuit connected between the first gain enhancement circuit and the second gain enhancement circuit on one side and a reference potential on the other side. The reference potential may be a ground connection. The first gain enhancement circuit and the second gain enhancement circuit have a common current branch and are being configured to provide two concurrent feedforward paths to a combining circuit.

The following figures illustrate various exemplary embodiments of the present invention. However, it should be noted that the present invention is not limited to the exemplary embodiments illustrated in the following figures.

IV. BRIEF DESCRIPTION OF THE DRAWINGS

Figure 6A:
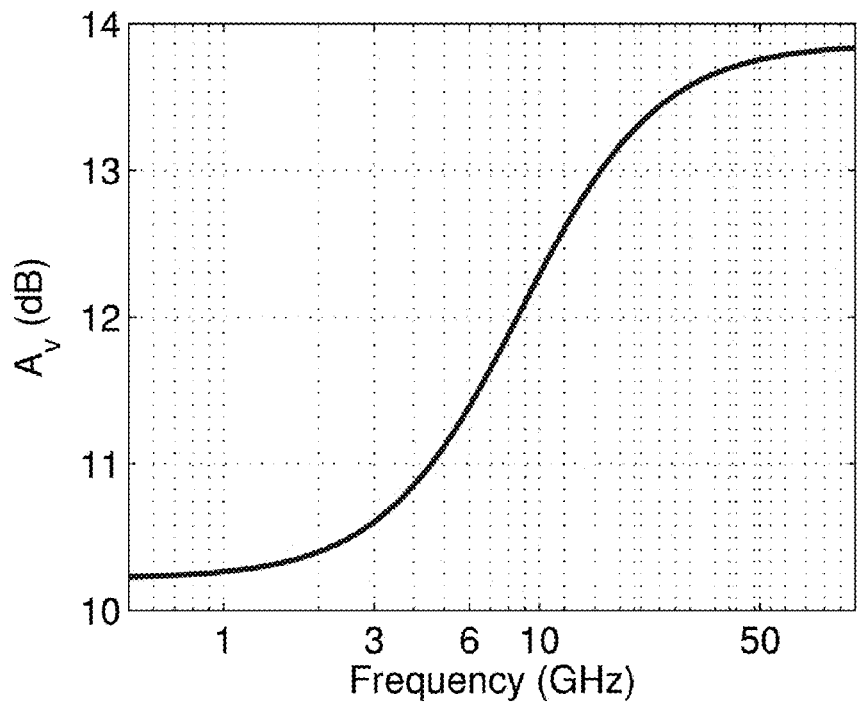
Figure 6B:
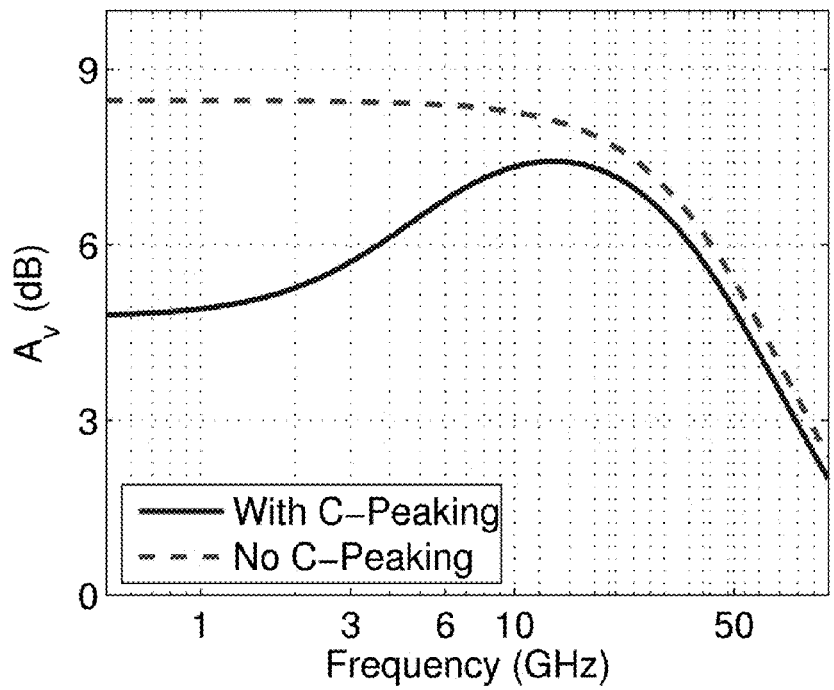
Figure 7:
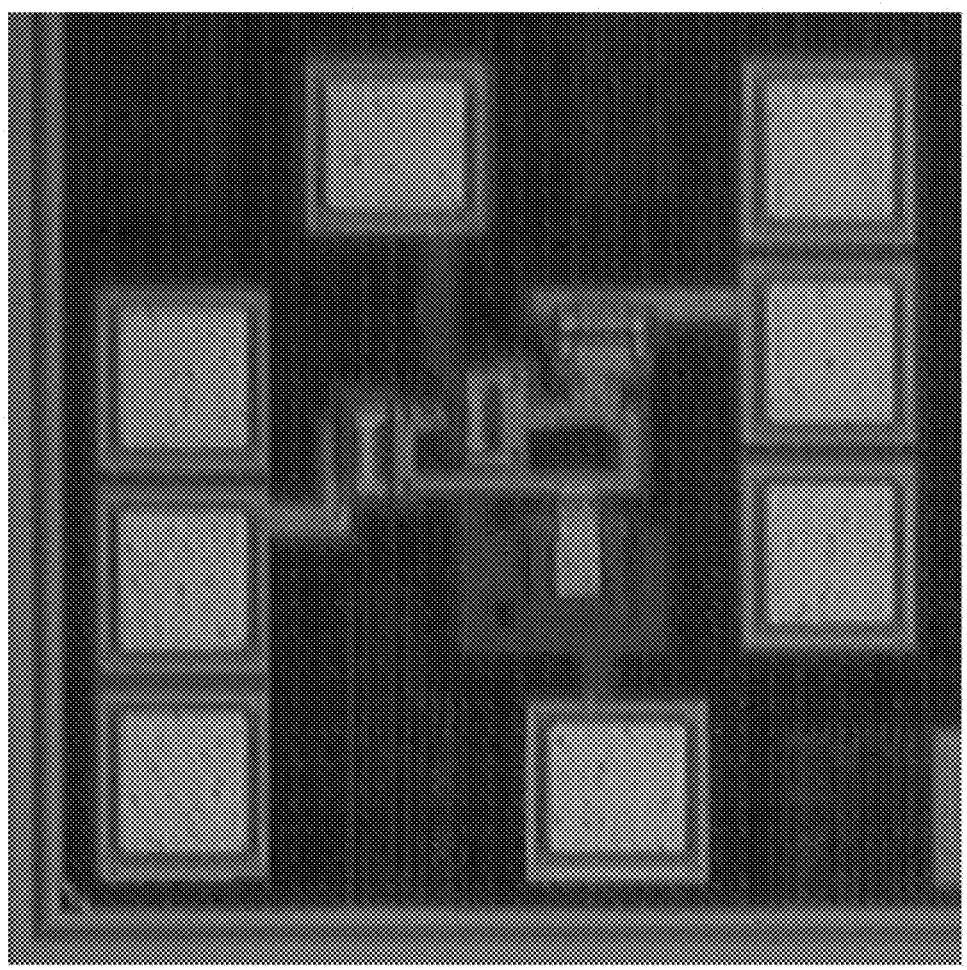
Figure 8:
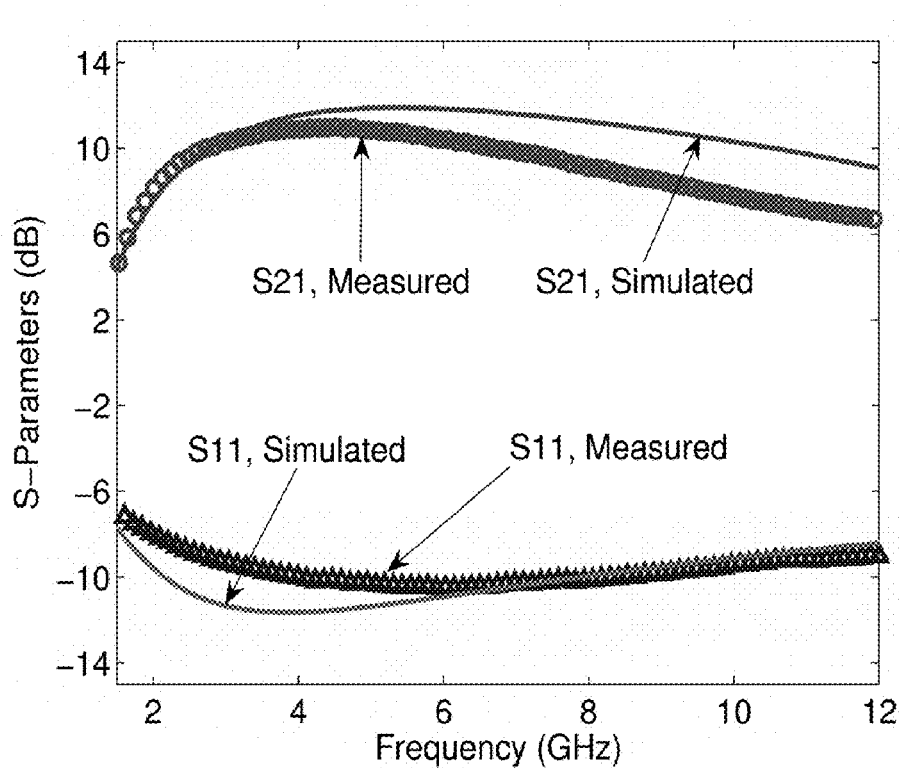
Figure 9:
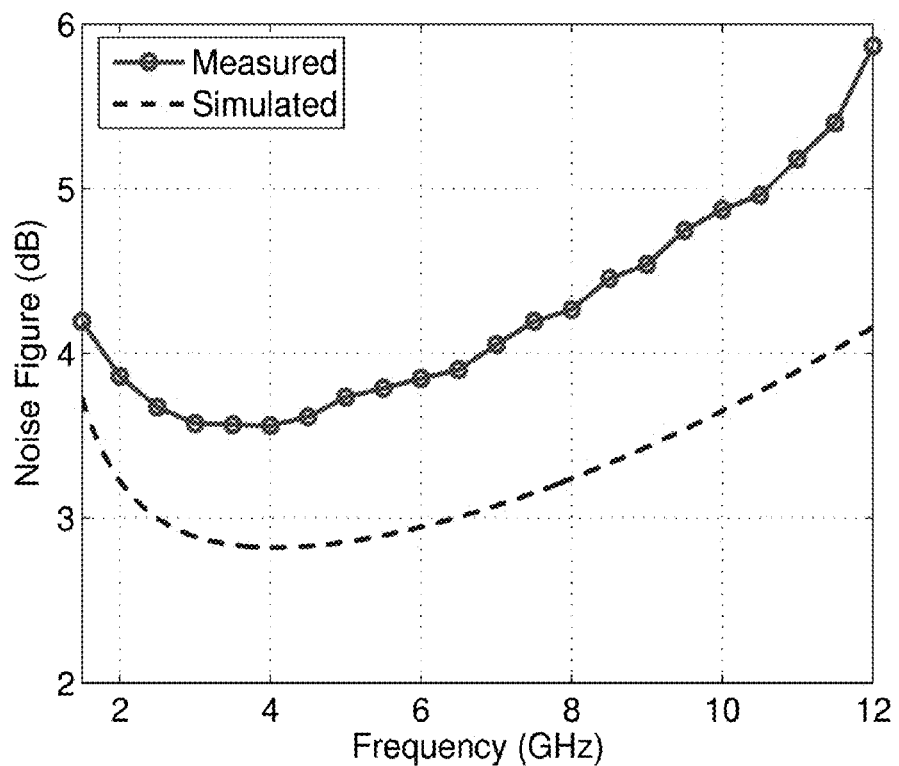

FIG. 6A shows a graph of simulated performance of voltage gain (Av) versus frequency (F) of a common-source circuit with capacitive-peaking based on calculated gain according to an embodiment of the present invention and FIG. 6B shows a graph of simulated performance of voltage gain (Av) versus frequency (F) of a common-source circuit with and without capacitive-peaking based on actual circuit implementation according to an embodiment of the present invention;

FIG. 7 shows a die microphotograph of a fabricated low noise amplifier chip according to an embodiment of the present invention;

FIG. 8 shows a graph of simulated and measured performance of power gain ($S_{21}$) and input return loss ($S_{11}$) versus frequency according to an embodiment of the present invention;

FIG. 9 shows a graph of simulated and measured performance of noise figure versus frequency according to an embodiment of the present invention;

V. DETAILED DESCRIPTION OF THE INVENTION

Exemplary embodiments of a low noise amplifier with noise cancellation and increased gain are described in details below with reference to the accompanying figures. In addition, the exemplary embodiments described below can be modified in various aspects without changing the essence of the invention.

Figure 1:
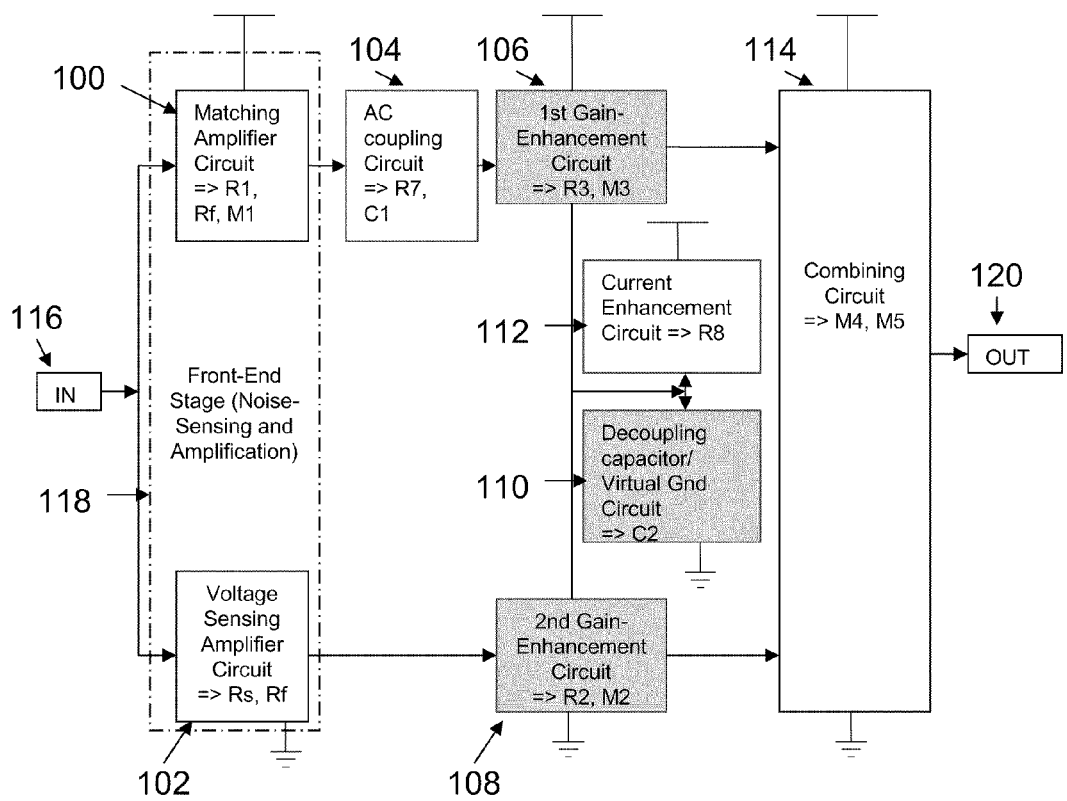
FIG. 1 shows a block level representation of the architecture of the low noise amplifier circuit according to an embodiment of the present invention.

FIG. 1 shows a block level representation of the architecture of the low noise amplifier circuit according to an embodiment of the present invention. The architecture of the low noise amplifier comprises of the following functional blocks, namely a matching amplifier circuit 100, a voltage sensing circuit 102, an alternating current (AC) coupling circuit 104, a first gain enhancement circuit 106, a second gain enhancement circuit 108, a virtual ground circuit 110, a current enhancement circuit 112 and a combining circuit 114. Signal from an input source 116 is delivered to an input of the voltage sensing amplifier circuit 102 and an input of the matching amplifier circuit 100 respectively. The voltage sensing amplifier circuit 102 senses the signal and noise voltages across the input source 116. The voltage sensing amplifier circuit 102 comprises of a source resistor (Rs) and a feedback resistor (Rf). The matching amplifier circuit 100 provides matching to the source impedance (Rs) of the input source 116. The matching amplifier circuit 100 comprises of a resistor (R1), a feedback resistor (Rf) and a transistor (M1). The matching amplifier circuit 100 and the voltage sensing amplifier circuit 102 forms a front end voltage sensing and matching amplification circuit 118 where signal and noise sensing and matching amplification are performed in a single circuit having an input and two outputs. The output signal from the matching amplifier circuit 100 is delivered to an input of the AC coupling circuit 104. The AC coupling circuit 104 comprises of a resistive element (R7) and a capacitive element (C1). The output signal of the AC coupling circuit 104 is delivered to an input of the first gain enhancement circuit 106. The first gain enhancement circuit 106 comprises of a resistor (R3) and a transistor (M3). The output signal of the voltage sensing amplifier circuit 102 is delivered to an input of the second gain enhancement circuit 108. The second gain enhancement circuit 108 is coupled to the first gain enhancement circuit 106 and comprises of a resistor (R2) and a transistor (M2). The virtual ground circuit 110 or a decoupling capacitor is configured between the first gain enhancement circuit 106 and the second gain enhancement circuit 108 for creating a ground node at high frequency. The virtual ground circuit 110 comprises of a capacitor (C2). The current enhancement circuit 112 is configured between the first gain enhancement circuit 106 and the second gain enhancement circuit 108 and is in connection with the virtual ground circuit 110. The current enhancement circuit 112 provides extra current to the second gain enhancement circuit 108 and comprises a resistor (R8). The output signal from the first gain enhancement circuit 106 and the output signal from the second gain enhancement circuit 108 are combined in the combining circuit 114 to produce an output signal 120. The first gain enhancement circuit 106, the second gain enhancement circuit 108 and the virtual ground circuit 110 forms a gain circuit positioned between the front end voltage sensing and matching amplification circuit 118 and the combining circuit 114 to provide gain enhancement to the low noise amplifier circuit. The gain circuit receives two input signals and generates two output signals which are subsequently combined by the combining circuit 114.

Figure 2:
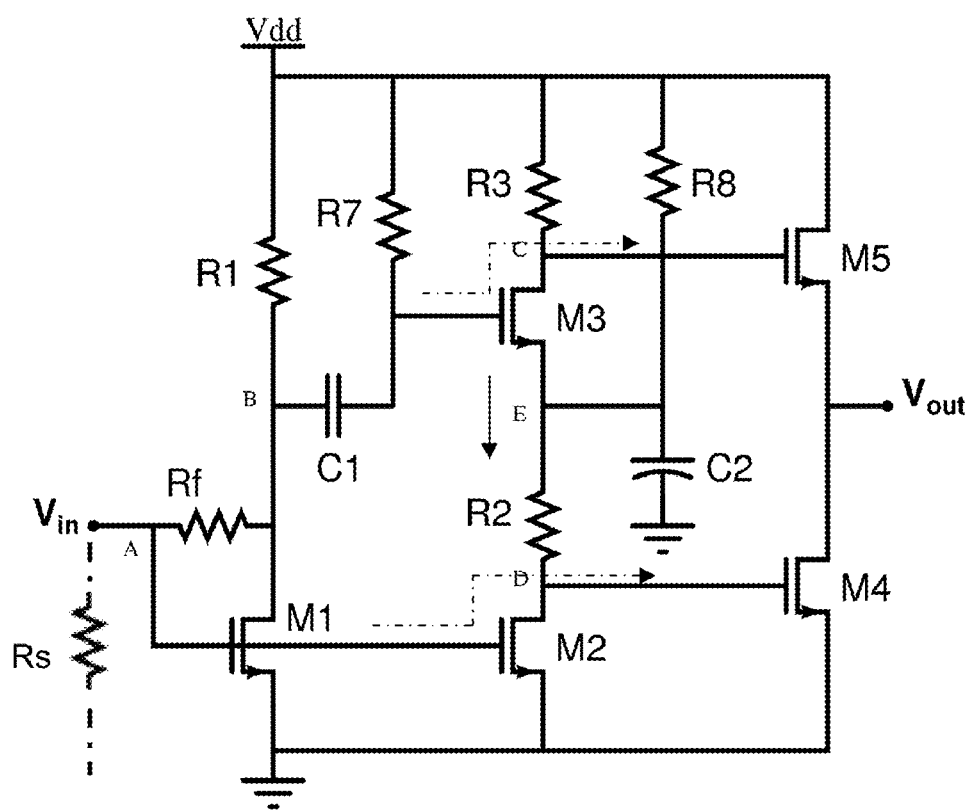
FIG. 2 shows a circuit level representation of the architecture of the low noise amplifier circuit according to an embodiment of the present invention.

FIG. 2 shows a circuit level representation of the architecture of the low noise amplifier circuit according to an embodiment of the present invention. The front end voltage sensing and matching amplification circuit comprising of a voltage sensing amplifier circuit and a matching amplifier circuit. The voltage sensing amplifier circuit comprises of the source resistor (Rs) of the input source and the feedback resistor (Rf). The feedback resistor (Rf) comprises two ends, a first end coupled to the source resistor (Rs) and a second end coupled to the matching amplifier circuit. The matching amplifier circuit comprises a resistor (R1), the feedback resistor (Rf) and a transistor (M1). The transistor (M1) is an NMOS comprising of a source terminal, a gate terminal and a drain terminal. The source terminal of the transistor (M1) is coupled to a ground connection, the gate terminal of the transistor (M1) is coupled to the first end of the feedback resistor (Rf) and the drain terminal of the transistor (M1) is coupled to the second end of the feedback resistor (Rf), the resistor (R1) and an AC coupling circuit. The resistor (R1) comprises two ends, a first end coupled to the drain terminal of the transistor (M1), the second end of the feedback resistor (Rf) and the AC coupling circuit and a second end is coupled to a power supply. The AC coupling circuit comprises a capacitor (C1) and a resistor (R7). The capacitor (C1) comprises two ends, a first end is coupled to the first end of the resistor (R1), the second end of the feedback resistor (Rf) and the drain terminal of the transistor (M1) and a second end is coupled to the resistive element (R7). The resistor (R7) comprises two ends, a first end coupled to the second end of the capacitor (C1) and a first gain enhancement circuit and a second end coupled to a power supply. The first gain enhancement circuit comprises a transistor (M3) and a resistor (R3). The transistor (M3) is a NMOS comprising of a source terminal, a gate terminal and a drain terminal. The source terminal of the transistor (M3) is coupled to a second gain enhancement circuit, a virtual ground circuit and a current enhancement circuit, the gate terminal is coupled to the second end of the capacitor (C1) and the first end of the resistor (R7) and the drain terminal is coupled to the resistor (R3) and a combining circuit. The resistor (R3) comprises two ends, a first end coupled to the drain terminal of the transistor (M3) and the combining circuit and a second end coupled to the power supply. The second gain enhancement circuit shares the same direct current (DC) branch with the first gain enhancement circuit (as shown by the arrow between transistor (M3) and resistor (R2)). The second gain enhancement circuit comprises a transistor (M2) and a resistor (R2). The transistor (M2) is a NMOS comprising of a source terminal, a gate terminal and a drain terminal. The source terminal of the transistor (M2) is coupled to the ground connection, the gate terminal is coupled to the first end of the feedback resistor (Rf) and the gate terminal of the transistor (M1) and the drain terminal is coupled to the resistor (R2) and the combining circuit. The resistor (R2) comprises two ends, a first end coupled to the drain terminal of the transistor (M2) and the combining circuit and a second end coupled to the first gain enhancement circuit, the virtual ground circuit and the current enhancement circuit. The virtual ground circuit comprises a large decoupling capacitor (C2) that creates a ground node at high frequency. The capacitor (C2) comprises two ends, a first end coupled to the second end of the resistor (R2), source terminal of the transistor (M3) and a first end of a resistor (R8) and a second end is coupled to a ground connection. The current enhancement circuit comprises the resistor (R8). The second end of the resistor (R8) is connected to the power supply. The combining circuit comprises two transistors (M4, M5). Both the transistors (M4, M5) are NMOS comprising of a source terminal, a gate terminal and a drain terminal respectively. The source terminal of the transistor (M4) is coupled to the ground connection, the gate terminal is coupled to the drain terminal of the transistor (M2) and the first end of the resistor (R2) and the drain terminal is coupled to source of the transistor (M5), giving rise to the output signal. The gate terminal of the transistor (M5) is coupled to the drain terminal of the transistor (M3) and the first end of the resistor (R3) and the drain terminal is coupled to the power supply.

In FIG. 2, the gain circuit comprising of the first gain enhancement circuit, the second gain enhancement circuit and the virtual ground circuit provides two concurrent feedforward paths from the front end voltage sensing and matching amplification circuit to the combining circuit (as shown by the dotted arrows). The gain ratio of the two feedforward paths can be kept unchanged if the parameters of the first gain enhancement circuit comprising of transistor (M2), resistor (R2) and second gain enhancement circuit comprising of transistor (M3), resistor (R3) are given the same values in the absence of resistor (R8). However, the gain enhancement circuits contribute additional noise as well. Therefore using the same parameters for both the first gain enhancement circuit and the second gain enhancement circuit may not always be the optimal choice in terms of overall noise performance. The analysis can be shown below. In addition, the low noise amplifier circuit with gain circuit as shown in FIG. 2 can be shown to achieve a gain-enhancement factor of $gm_3R_3$ when compared with the architecture without the gain circuit as shown in prior art publication "Wide-band CMOS Low-Noise Amplifier Exploiting Thermal Noise Canceling", Federico Bruccoleri et. al, IEEE Journal of Solid-State Circuits, Vol. 39, No. 2, Feb. 2004.

The analysis is as follows:

The gain $A_{v,2}$ of the output common-source stage or combining circuit (M4 and M5) with output noise cancellation is $$A_{v,2} = 1 + R_f/R_s \tag{1}$$

This relationship has been stated in prior art publication "Wide-band CMOS Low-Noise Amplifier Exploiting Thermal Noise Canceling", Federico Bruccoleri et. al, IEEE Journal of Solid-State Circuits, Vol. 39, No. 2, Feb. 2004 and serves as a reference for comparison for the enhanced gain of the low noise amplifier circuit as shown in FIG. 2. At node C of FIG. 2, the noise voltage due to the first gain enhancement circuit (M3 and R3) can be expressed as $$V^2_{n,c} = 4\,kT \cdot (NEF \cdot g_{m3} + 1/R_3)R_3^2 \cdot \Delta f \quad (2)$$

Where

Noise excess factor $(NEF) = \gamma \cdot g_{ds0}/g_m$, ($g_{ds0}$ is the channel conductance when $V_{DS}=0$) (for submicron MOSFETs, NEF is well above 1)

$\Delta f$ is the calculation bandwidth.

Practically, $NEF \cdot g_{m3} \gg 1/R_3$. In addition, the case where noise per unit bandwidth is also considered.

Thus, equation (2) can be simplified as $$V^2_{n,c} = 4\,kT \cdot NEF \cdot g_{m3} R_3^2 \quad (3)$$

Similarly, at node D, the noise voltage due to second gain enhancement circuit (M2 and R2) can be expressed as $$V^2_{n,d} = 4\,kT \cdot NEF \cdot g_{m2} R_2^2 \quad (4)$$

The two noise voltages are uncorrelated. They can not be canceled by subsequent combining circuit.

Refer to the output node Vout, the noise due to first gain-enhancement circuit and second gain enhancement circuit is $$V^2_{n,out} = 4\,kT \cdot NEF \cdot (g_{m2} R_2^2 g_{m4}^2/g_{m5}^2 + g_{m3} R_3^2). \quad (5)$$

Equation (5) shows that the noise contribution of the second gain enhancement circuit (M2 and R2) is more significant than that of the first gain enhancement circuit (M3 and R3).

The output noise of matching device M1 can be canceled by properly designing of the gain in the two feedforward paths.

In FIG. 2, the cancellation condition is given by $$R_s \cdot g_{m2} R_2 \cdot g_{m4}/g_{m5} = (R_f + R_s) \cdot g_{m3} R_3. \quad (6)$$

Therefore, equation (5) becomes $$V^2_{n,out} = \alpha \cdot (g_{m3} R_3)^2 [(1 + R_f/R_s)^2/g_{m2} + 1/g_{m3}] \quad (7)$$

where $\alpha = 4kT \cdot NEF$.

From equation (7), the noise contribution of gain-enhancement circuit can be minimized when $$g_{m2}/g_{m3} = (1 + R_f/R_s)^2 \quad (8)$$

And the minimum output noise voltage is $$V^2_{n,out} = 2 \cdot \alpha \cdot g_{m3} R_3^2 \quad (9)$$

Note that equations (7) to (9) are obtained under the noise cancellation condition for the input matching amplifier circuit.

From equation (8), the condition in equation (6) can be simplified as $$g_{m5}/g_{m4} = R_2/R_3(1 + R_f/R_s). \quad (10)$$

Consider the overall small-signal gain, we have $$A_V = A_{v,1} \cdot g_{m3} R_3 + g_{m2} R_2 \cdot g_{m4}/g_{m5} \quad (11)$$
$$= (A_{v,1} + 1 + R_f/R_s) \cdot g_{m3} R_3$$

where $A_{v,1}$ is the gain of input matching amplifier circuit, $$A_{v,1} = (g_{m1} R_f - 1) R_1/R_f + R_1. \quad (12)$$

The result is a gain-enhancement factor $g_{m3} R_3$ when compared with the architecture in prior art publication "Wideband CMOS Low-Noise Amplifier Exploiting Thermal Noise Canceling", Federico Bruccoleri et. al, IEEE Journal of Solid-State Circuits, Vol. 39, No. 2, Feb. 2004 whose gain is ($A_{v,1}$+1+$R_f/R_s$).

Figure 3:
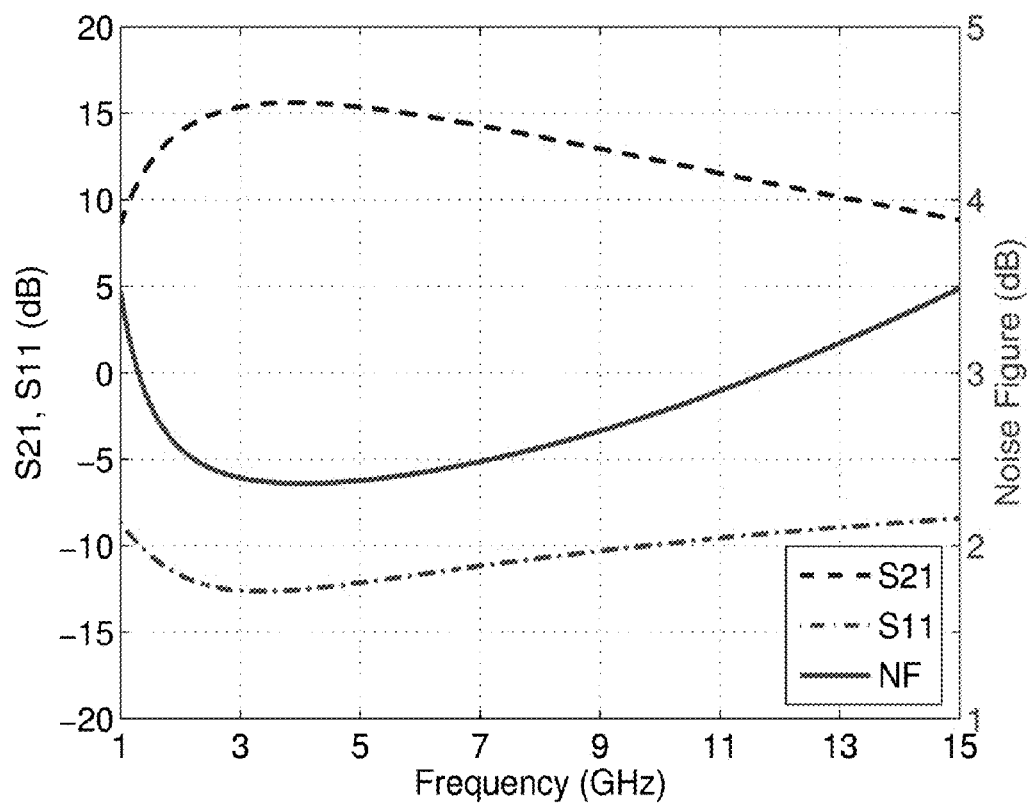
FIG. 3 shows a graph of simulated performance of scattering parameters (S11, S21) versus frequency (F) and noise figure (NF) versus frequency (F) based on the architecture of the low noise amplifier according to an embodiment of the present invention.

FIG. 3 shows a graph of simulated performance of scattering parameters (S11, S21) versus frequency (F) and noise figure (NF) versus frequency (F) based on the architecture of the low noise amplifier according to FIG. 2. 2 pF capacitors are used for input and output coupling. A simulated performance with noise figure of about 2.4 to 2.8 dB, gain (S21) of about 12 to 15.6 dB and input matching S11<−10 dB are achieved at a frequency range of between about 3.1 to 10.6 GHz. With basic considerations of parasitic capacitances, the −3 dB bandwidth is about 1.5 to 9 GHz. The whole circuit draws only about 10.8 mA of current with low supply voltage of about 1.2V.

Figure 4:
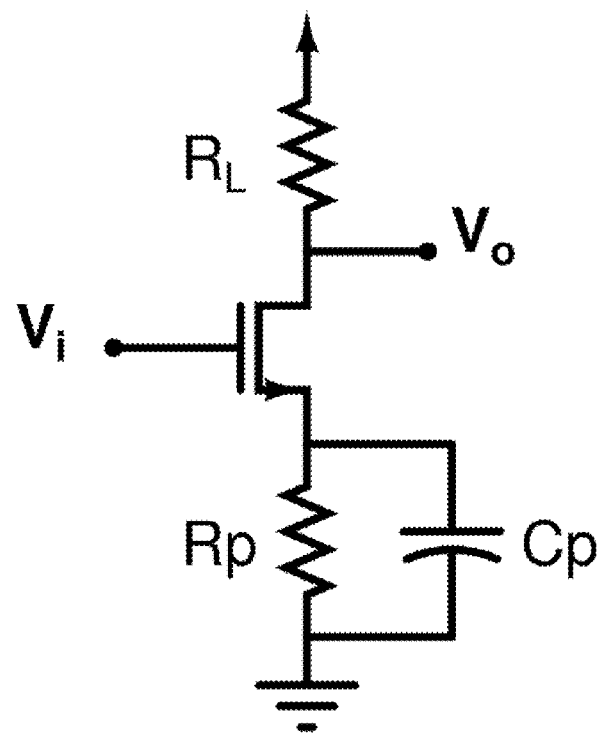
FIG. 4 shows a schematic of a capacitive-peaking common-source circuit.

Conventional inductor-peaking techniques can be applied to the architecture of FIG. 2 to further widen the −3-dB bandwidth beyond 10.6-GHz. However, excessive silicon area will be consumed by the large passive components. Therefore, an inductorless approach using capacitive peaking is exploited. FIG. 4 shows a schematic of a capacitive-peaking common-source circuit. It is adopted from the source degeneration architecture. The capacitive-peaking common-source circuit 122 comprises of a transistor, a resistor $R_L$, a resistor $R_p$ and a capacitor $C_p$.

The gain of this circuit 122 can be written as $$A_v = -R_L/1/g_m + R_p | C_p = -R_L/1/g_m + 1/1/R_p + j\omega C_s \quad (13)$$

For the first order, $C_p$ provides an increased $A_v$ regarding frequency. This effect can be understood conceptually from the resistive degeneration architecture. It is well known that a source-degenerative resistor $R_p$ degrades gain and improves linearity while capacitor $C_p$ provides a signal path in parallel with $R_p$ to a ground connection. At high frequencies, the path through $C_p$ has low impedance. Thus, the resistive degeneration effect is degraded by $C_p$ with the increasing frequency, resulting in an increasing gain characteristic.

Figure 5:
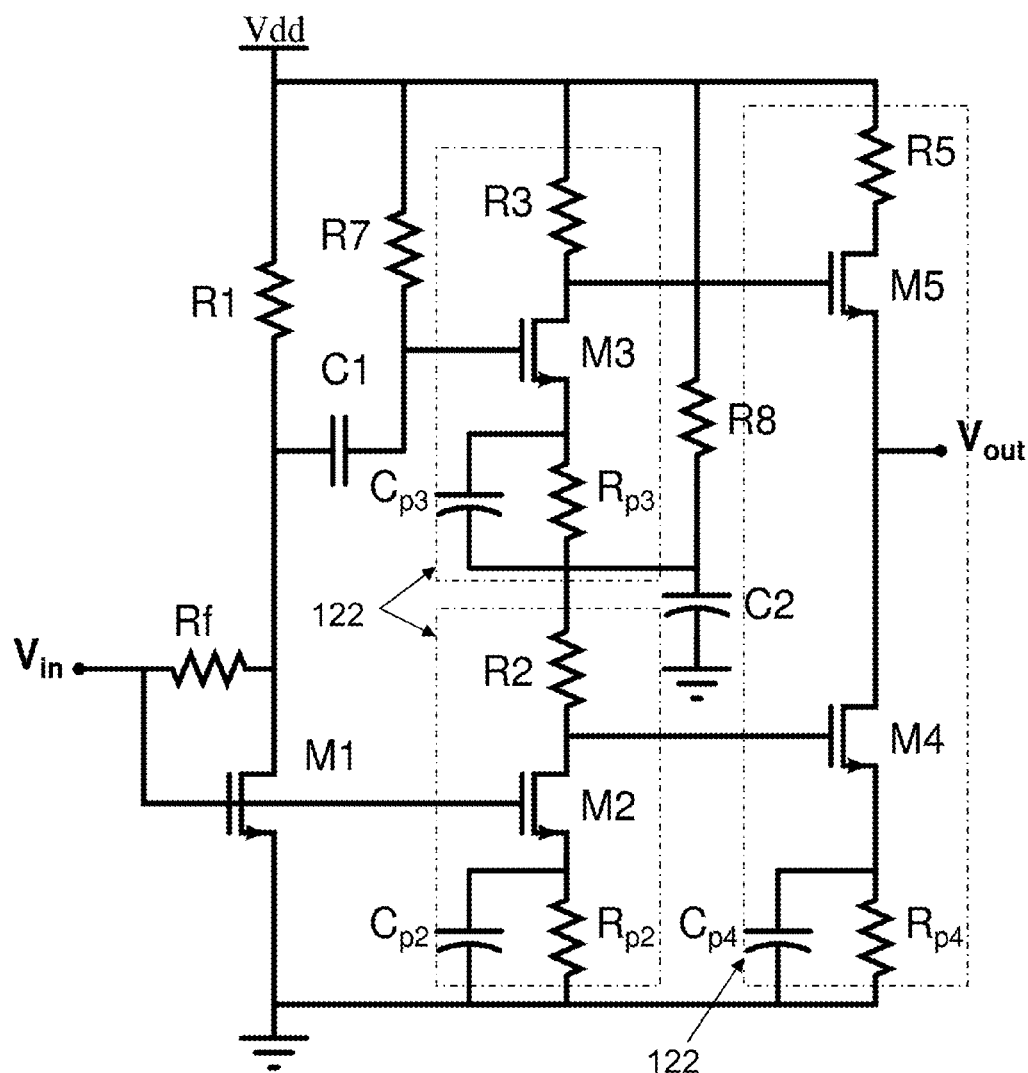
FIG. 5 shows a circuit level representation of the architecture of the low noise amplifier circuit with capacitive-peaking common-source circuit according to an embodiment of the present invention.

FIG. 5 shows a circuit level representation of the architecture of the low noise amplifier with capacitive-peaking according to an embodiment of the present invention. The capacitive-peaking circuits 122 are implemented in the first gain enhancement circuit, the second gain enhancement circuit and the combining circuit respectively. These capacitive-peaking circuits 122 are highlighted in dotted boxes.

The capacitive-peaking circuit 122 implemented in the first gain enhancement circuit results in an additional capacitor ($C_{p3}$) and resistor ($R_{p3}$) in FIG. 5 when compared to the circuit in FIG. 2. The capacitor ($C_{p3}$) comprises two ends, a first end is coupled to a first end of the resistor ($R_{p3}$) and a second end is coupled to a second end of the resistor ($R_{p3}$). The first end of the capacitor ($C_{p3}$) and the first end of the resistor ($R_{p3}$) is coupled to a capacitor (C2) and a resistor (R2). The second end of the capacitor ($C_{p3}$) and the second end of the resistor ($R_{p3}$) is coupled to the source terminal of the transistor (M3).

The capacitive-peaking circuit 122 implemented in the second gain enhancement circuit results in an additional capacitor ($C_{p2}$) and resistor ($R_{p2}$) in FIG. 5 when compared to the circuit in FIG. 2. The capacitor ($C_{p2}$) comprises two ends, a first end is coupled to a first end of the resistor ($R_{p2}$) and a second end is coupled to a second end of the resistor ($R_{p2}$).

The first end of the capacitor ($C_{p2}$) and the first end of the resistor ($R_{p2}$) is coupled to a ground connection. The second end of the capacitor ($C_{p2}$) and the second end of the resistor ($R_{p2}$) is coupled to the source terminal of the transistor (M2).

The capacitive-peaking circuit 122 implemented in the combining circuit results in an additional capacitor ($C_{p4}$) and resistor ($R_{p4}$) in FIG. 5 when compared to the circuit in FIG. 2. The capacitor ($C_{p4}$) comprises two ends, a first end is coupled to a first end of the resistor ($R_{p4}$) and a second end is coupled to a second end of the resistor ($R_{p4}$). The first end of the capacitor ($C_{p4}$) and the first end of the resistor ($R_{p4}$) is coupled to a ground connection. The second end of the capacitor ($C_{p4}$) and the second end of the resistor ($R_{p4}$) is coupled to the source terminal of the transistor (M4). The capacitive-peaking circuit implemented in the combining circuit also results in an additional resistor (R5) in FIG. 5 when compared to the circuit in FIG. 2.

FIG. 6A shows a graph of simulated performance of voltage gain (Av) versus frequency (F) of a common-source circuit with capacitive-peaking based on calculated gain according to equation (13) as stated previously. In FIG. 6A, the parameters are as follows: gm=20 mS, $R_L$=100Ω, $R_p$=10Ω, $C_p$=2 pF. From FIG. 6A, it can be seen that the peaking is clear, which compensates for the high frequency gain drop due to parasitic capacitances.

FIG. 6B shows a graph of simulated performance of voltage gain (Av) versus frequency (F) of a common-source circuit with and without capacitive-peaking based on actual circuit implementation as shown in FIG. 2 and FIG. 5 respectively. In FIG. 6B, the parameters are set to be the same as in FIG. 6A. The parameters are as follows: gm=20 mS, $R_L$=100Ω, $R_p$=10Ω, $C_p$=2 pF. From FIG. 6B, clear gain peaking is observed. At low frequencies, around 3-dB gain degradation is found between the plot with capacitive-peaking and the plot without capacitive-peaking, which exhibits the effect of resistor degeneration.

Experimental Results

The efficiency of the new low noise amplifier circuit was verified by experimental results of the fabricated integrated circuit (IC) chip. The low noise amplifier circuit was fabricated in a two-poly eight-metal 0.13 μm triple-well CMOS technology. The cut off frequency $F_T$ of NMOS transistor is over 90 GHz.

FIG. 7 shows a die microphotograph 124 of a fabricated low noise amplifier chip according to an embodiment of the present invention. As the passive devices used are only resistors and capacitors, the low noise amplifier chip with test pad occupies an area of only about 415 μm×415 μm, which is relatively small.

The measurement of the LNA chip is performed on wafer using Cascade G-S-G RF probes. FIG. 8 shows a graph of simulated and measured performance of power gain ($S_{21}$) and input return loss ($S_{11}$) versus frequency according to an embodiment of the present invention. $S_{21}$ is equivalent to the voltage or current gain of the amplifier. Similarly, the magnitude of the square of $S_{21}$ is equal to the power gain. The simulated maximum power gain is approximately 12.5 dB and the −3 dB bandwidth is approximately 3 to 11.7 GHz. The measured maximum power gain is approximately 11 dB and the −3 dB bandwidth is approximately 2 to 9.6 GHz. The frequency dependent difference when comparing the measured power gain to the simulated power gain is most likely due to the extra parasitic capacitances in the real chip. Measurement shows that the LNA only draws about 12.65 mA from a low supply voltage of about 1.5 V. The simulated input return loss is approximately −10 dB over 2 to 8 GHz. The measured input return loss is less than −9 dB over 2.8 to 12 GHz, which shows the resistive shunt feedback, can effectively offer a 50Ω matching resistance over the UWB frequencies.

FIG. 9 shows a graph of simulated and measured performance of noise figure versus frequency according to an embodiment of the present invention. FIG. 9 shows that the simulated noise figure is approximately 2.8 to 3.6 dB over a frequency range of approximately 2 to 9.6 GHz. FIG. 9 also shows that the measured noise figure is higher at approximately 3.6 to 4.8 dB over the same frequency range. Therefore the average noise figure over a frequency range of approximately 2 to 9.6 GHz is approximately 4 dB.

The aforementioned description of the various embodiments has been presented for purposes of illustration and description. It is not intended to be exhaustive or to limit the invention to the precise form disclosed, and obviously many modifications and variations are possible in light of the disclosed teaching. It is intended that the scope of the invention be defined by the claims appended hereto.

What is claimed is:

1. A low noise amplifier circuit, comprising
a front end voltage sensing and matching amplification circuit having an input and two outputs, the front end voltage sensing and matching amplification circuit providing a matched signal at each output;
a gain circuit having two inputs, each input being respectively coupled to at least one of the two outputs of the front end voltage sensing and matching amplification circuit, the gain circuit further having two outputs, an output signal being provided at each output of the gain circuit; and
a combining circuit combining the two output signals of the gain circuit, the combining circuit having two inputs, each input being respectively coupled to at least one of the two outputs of the gain circuit, the combining circuit further comprising an output providing a combined signal;
wherein the gain circuit comprising
a first gain enhancement circuit having an input coupled to a first output of the front end voltage sensing and matching amplification circuit and an output coupled to a first input of the combining circuit;
a second gain enhancement circuit coupled to the first gain enhancement circuit and having an input coupled to a second output of the front end voltage sensing and matching amplification circuit and an output coupled to a second input of the combining circuit; and
a virtual ground circuit connected between the first gain enhancement circuit and the second gain enhancement circuit on one side and a reference potential on the other side;
the first gain enhancement circuit and the second gain enhancement circuit having a common current path and being configured to provide two concurrent feedforward paths to the combining circuit.

2. The low noise amplifier circuit of claim 1, further comprising an alternating current coupling circuit having an input coupled to the first output of the front end voltage sensing and matching amplification circuit and an output coupled to the input of the first gain enhancement circuit.

3. The low noise amplifier circuit of claim 2, the alternating current coupling circuit further comprising a capacitive element and a resistive element.

4. The low noise amplifier circuit of claim 1, further comprising a current enhancement circuit connected between the first gain enhancement circuit and the second gain enhancement circuit, the current enhancement circuit providing additional current to the second gain enhancement circuit.

5. The low noise amplifier circuit of claim 4, the current enhancement circuit further being connected to the virtual ground circuit.

6. The low noise amplifier circuit of claim 5, the current enhancement circuit comprising a resistive element.

7. The low noise amplifier circuit of claim 1, the virtual ground circuit comprising a capacitive element, a first terminal of which being connected to the first gain enhancement circuit and the second gain enhancement circuit and a second terminal of which being connected to the reference potential.

8. The low noise amplifier circuit of claim 1, the front end voltage sensing and matching amplification circuit comprising a voltage sensing amplifier circuit and a matching amplifier circuit.

9. The low noise amplifier circuit of claim 8, the voltage sensing amplifier circuit comprising an input and an output, the output being coupled to an input of the second gain enhancement circuit.

10. The low noise amplifier circuit of claim 8, the voltage sensing amplifier circuit comprising a feedback resistor and a source resistor sensing the voltage applied to the input of the voltage sensing amplifier circuit.

11. The low noise amplifier circuit of claim 8, the matching amplifier circuit comprising an input and an output being coupled to the first gain enhancement circuit.

12. The low noise amplifier circuit of claim 8, the matching amplifier circuit comprising the feedback resistor, a resistive element and a transistor providing the source resistor matching.

13. The low noise amplifier circuit of claim 1, the first gain enhancement circuit comprising a transistor and a resistive element.

14. The low noise amplifier circuit of claim 1, the second gain enhancement circuit comprising a transistor and a resistive element.

15. The low noise amplifier circuit of claim 1, the combining circuit comprising two serially coupled transistors.

16. The low noise amplifier circuit of claim 1, further comprising a first capacitor peaking circuit connected between the first gain enhancement circuit and the second gain enhancement circuit.

17. The low noise amplifier circuit of claim 16, the first capacitor peaking circuit comprising a capacitive element and a resistive element.

18. The low noise amplifier circuit of claim 1, further comprising a second capacitor peaking circuit connected between the second gain enhancement circuit and a reference potential.

19. The low noise amplifier circuit of claim 18, the second capacitor peaking circuit comprising a capacitive element and a resistive element.

20. The low noise amplifier circuit of claim 1, further comprising a third capacitor peaking circuit connected between the combining circuit and a reference potential.

21. The low noise amplifier circuit of claim 20, the third capacitor peaking circuit comprising a capacitive element and a resistive element.

22. A gain circuit in a low noise amplifier, the gain circuit comprising:
- a first gain enhancement circuit having an input coupled to a first output of a front end voltage sensing and matching amplification circuit and having an output;
- a second gain enhancement circuit coupled to the first gain enhancement circuit and having an input coupled to a second output of the front end voltage sensing and matching amplification circuit and having an output; and
- a virtual ground circuit connected between the first gain enhancement circuit and the second gain enhancement circuit on one side and a reference potential on the other side;
- the first gain enhancement circuit and the second gain enhancement circuit having a common current path and being configured to provide two concurrent feedforward paths to a combining circuit.

* * * * *